United States Patent
Hajimiri et al.

(10) Patent No.: US 11,031,823 B2
(45) Date of Patent: Jun. 8, 2021

(54) DYNAMIC VOLUMETRIC REFOCUSING OF ARRAYS

(71) Applicant: GuRu Inc., Pasadena, CA (US)

(72) Inventors: Seyed Ali Hajimiri, Pasadena, CA (US); Farhud Tebbi, Pasadena, CA (US); Florian Bohn, Pasadena, CA (US); Behrooz Abiri, Pasadena, CA (US)

(73) Assignee: GURU INC., Pasadena, CA (US)

( * ) Notice: Subject to any disclaimer, the term of this patent is extended or adjusted under 35 U.S.C. 154(b) by 0 days.

(21) Appl. No.: 16/691,598

(22) Filed: Nov. 21, 2019

(65) Prior Publication Data
US 2020/0204002 A1    Jun. 25, 2020

Related U.S. Application Data

(60) Provisional application No. 62/770,660, filed on Nov. 21, 2018.

(51) Int. Cl.
*H02J 50/20* (2016.01)
*H04W 52/02* (2009.01)
*H03M 13/45* (2006.01)
*H03M 13/37* (2006.01)

(52) U.S. Cl.
CPC ......... *H02J 50/20* (2016.02); *H03M 13/3761* (2013.01); *H03M 13/45* (2013.01); *H04W 52/0206* (2013.01)

(58) Field of Classification Search
CPC ... H02J 50/20; H04W 52/0206; H03M 13/45; H03M 13/3761
See application file for complete search history.

(56) References Cited

U.S. PATENT DOCUMENTS

| | | | | |
|---|---|---|---|---|
| 5,400,037 A | * | 3/1995 | East | H02J 50/40 342/372 |
| 8,633,782 B2 | * | 1/2014 | Nagarkatti | H03F 3/20 333/17.3 |
| 2008/0218291 A1 | * | 9/2008 | Zhu | H03H 7/38 333/32 |
| 2012/0056689 A1 | * | 3/2012 | Spears | H03H 11/30 333/17.3 |
| 2013/0033118 A1 | * | 2/2013 | Karalis | H02J 50/70 307/104 |
| 2015/0171768 A1 | * | 6/2015 | Perreault | H03F 1/0227 330/251 |
| 2018/0143224 A1 | * | 5/2018 | Huang | G01R 15/148 |
| 2019/0006995 A1 | * | 1/2019 | Jurkov | H03F 1/56 |

* cited by examiner

*Primary Examiner* — Lewis G West
(74) *Attorney, Agent, or Firm* — Alston & Bird LLP

(57) ABSTRACT

An RF power delivery system includes, in part, an N×M array of transmitting elements disposed along N rows and M columns where M an N are integer numbers, and a phase adjustment unit adapted to receive information representative of a change in position of a device targeted to receive the RF power wirelessly from the device and generate a codeword in response, and apply the codeword to adjust phases of the array of transmitting elements.

8 Claims, 5 Drawing Sheets

DYNAMIC VOLUMETRIC REFOCUSING OF ARRAYS

CROSS REFERENCE TO RELATED APPLICATION

The present application claims benefit under 35 USC 119 (e) of U.S. provisional application No. 62/770,660, filed Nov. 21, 2018, the content of which is incorporated herein by reference in its entirety.

FIELD OF THE INVENTION

The present invention is related to wireless power delivery via an RF signal.

BACKGROUND OF THE INVENTION

Conventional wireless RF power delivery systems are generally slow to focus on a device targeted to receive and recover the power. A need therefore continues to exit for a fast and reliable technique for focusing the RF power on a relatively small region of space where the recovery device is located. The ability to rapidly refocus the RF power at a second location, that conventional systems lack, greatly enhances the overall utility of wireless power transfer

BRIEF SUMMARY OF THE INVENTION

An RF power delivery system, in accordance with one embodiment of the present invention, includes, in part, an N×M array of transmitting elements disposed along N rows and M columns, wherein M an N are integer numbers, and a phase adjustment unit adapted to receive information representative of a change in position of a device targeted to receive the RF power wirelessly from the device and generate a codeword in response, and apply the codeword to adjust phases of the array of transmitting elements.

In one embodiment, as the device moves from a first position defined by vector $\vec{R}_0$ to a second position defined by vector $\vec{R}_1$, a change in the codeword applied to adjust the phase of a first transmitting element positioned m unit vectors from an origin of the array and along a first axis, and n unit vectors from the origin along a second axis, is defined by a path length difference from the first transmitting element to the first and second positions.

In one embodiment, as the device moves from the first position to the second position, the change in the codeword applied to adjust the phase of the first transmitting element is further defined by a slope of a clock multiplier of a phase/frequency locked loop disposed in the phase adjustment unit. In one embodiment, as the device moves from the first position to the second position, the codeword applied to adjust the phase of the first transmitting element is retrieved from a look-up table.

In one embodiment, the device receiving the RF power determines its position using a sensor unit that may be an inertia measurement unit (IMU) or a global positioning system unit. In one embodiment, as the device moves from the first position to the second position, the change in the codeword is applied to adjust the phase of the first transmitting element is retrieved from a look-up table.

A method of transmitting RF power from an N×M array of transmitting elements disposed along N rows and M columns to a device, M and N being integers, in accordance with one embodiment of the present invention, includes, in part, receiving a position of a device wirelessly from the device, generating a codeword in response to the position of the device, and adjusting phases of the array of transmitting elements in accordance with the codeword.

In one embodiment, as the device moves from a first position defined by vector $\vec{R}_0$ to a second position defined by vector $\vec{R}_1$, a change in the codeword applied to adjust the phase of a first transmitting element positioned m unit vectors from an origin of the array and along a first axis, and n unit vectors from the origin along a second axis, is defined by a path length difference from the first transmitting element to the first and second positions.

In one embodiment, as the device moves from the first position to the second position, the change in the codeword applied to adjust the phase of the first transmitting element is further defined by a slope of a clock multiplier of a phase/frequency locked loop adapted to adjust the phases of the array of transmitting elements In one embodiment as the device moves from the first position to the second position, the codeword applied to adjust the phase of the first transmitting element is retrieved from a look-up table. In one embodiment, as the device moves from the first position to the second position, the change in the codeword is applied to adjust the phase of the first transmitting element is retrieved from a look-up table. In one embodiment device determines its position using a sensor unit selected such as an inertia measurement unit (IMU) or a global positioning system unit.

A method of refocusing the RF power from an N×M array of transmitting elements disposed along N rows and M columns to a device, M and N being integers, in accordance with one embodiment of the present invention, includes, in part, determining a first codeword for the transmitting elements delivering power to a recovery unit located at a first position in space, generating, by the recovery unit, information about a second position of the recovery unit as the recovery unit moves in space, calculating, at the recovery unit, a displacement vector defined by the first and second positions of the recovery unit, determining, at the array, the second position of the recovery unit using the displacement vector and the first position of the recovery unit, determining a second codeword for the transmitting elements in accordance with the second position of the recovery unit as determined by the array, and adjusting the phases of the transmitting elements using the second codeword to focus the RF signal at the second position.

An RF power delivery system, in accordance with one embodiment of the present invention includes, in part, an N×M array of transmitting elements disposed along N rows and M columns, wherein M an N are integer numbers, an antenna adapted to receive information representative of a second position of a recovery unit being targeted by the array to receive the RF power, said second position being transmitted to the array by the recovery unit, a look-up table storing phase information for each of the array transmit elements for a plurality of positions spaced about the array, a controller adapted to retrieve information from the look-up table in accordance with the second position; and a phase adjustment unit adapted to vary the phases of the array transmit elements using the retrieved information.

An RF power delivery system, in accordance with one embodiment of the present invention, includes, in part, an N×M array of transmitting elements disposed along N rows and M columns, wherein M an N are integer numbers, an antenna adapted to receive information representative of a displacement in a position of a recovery unit being targeted by the array to receive the RF power, said displacement being determined relative to a first position of the recovery unit known to the array and being transmitted to the array by the recovery unit, a look-up table storing phase information for each of the array transmit elements for a plurality of positions spaced about the array, a controller adapted to determine a second position of the recovery unit from the first position and the displacement and retrieve information from the look-up table in accordance with the second position; and a phase adjustment unit adapted to vary the phases of the array transmit elements using the retrieved information.

DETAILED DESCRIPTION OF THE INVENTION

Embodiments of the present invention are adapted to deliver and focus an RF signal rapidly on a device receiving the RF signal. Embodiments of the present invention may also be used in volumetric three-dimensional (3D) sensing, high efficiency data communication, and the like. A volumetric imaging system provides the ability to focus and redirect the RF energy rapidly in a three dimensional space and to a localized point, an ability that conventional beamforming approaches have failed to achieve. Dynamic volumetric refocusing eliminates the need for multiple, costly, time and energy consuming calibration and recalibrations required by conventional systems.

In a two dimensional array, the phase and amplitude of each element of a transmitting element is independently controlled. The phases may be synthesized from a centralized references signal, for example, using a phased locked loop (PLL) or controlled by other means, including, but not limited to, phase rotators, adjustable active buffer lines, phase shifters, or delay lines. Such an array is used, for example, to deliver power to a focal zone, in volumetric sensing, and the like.

Figure 1:
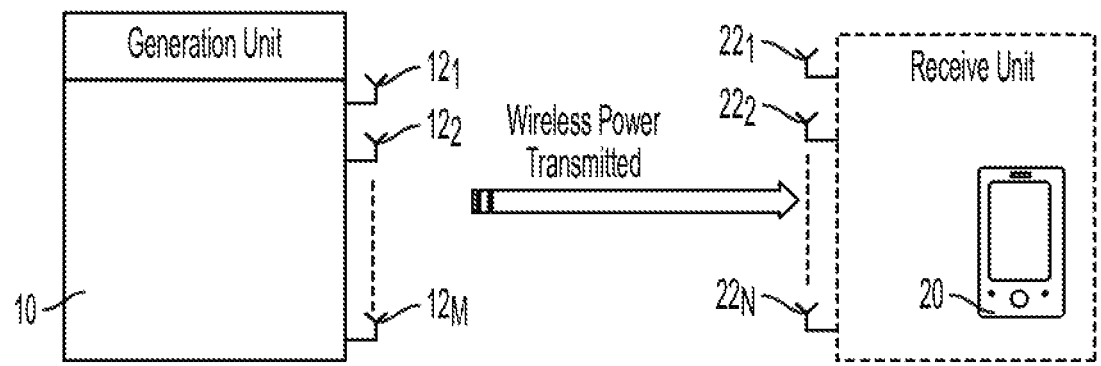
FIG. 1 shows an RF power transmitting/generating unit transmitting RF signals via a multitude of transmit antennas to a device, in accordance with one embodiment of the present invention.

FIG. 1 shows an RF power transmitting/generating unit (hereinafter alternatively referred to as GU) transmitting RF signals via M transmit antennas $12_1, 12_2 \ldots 12_M$ to a mobile device 20. Mobile device 20 is shown as having N receive antennas $22_1, 22_2 \ldots 22_N$ forming an element phased array receiver. The mobile device receiving the RF signal from the GU is alternatively referred to herein as receiving device or recovery unit (RU).

Figure 2:
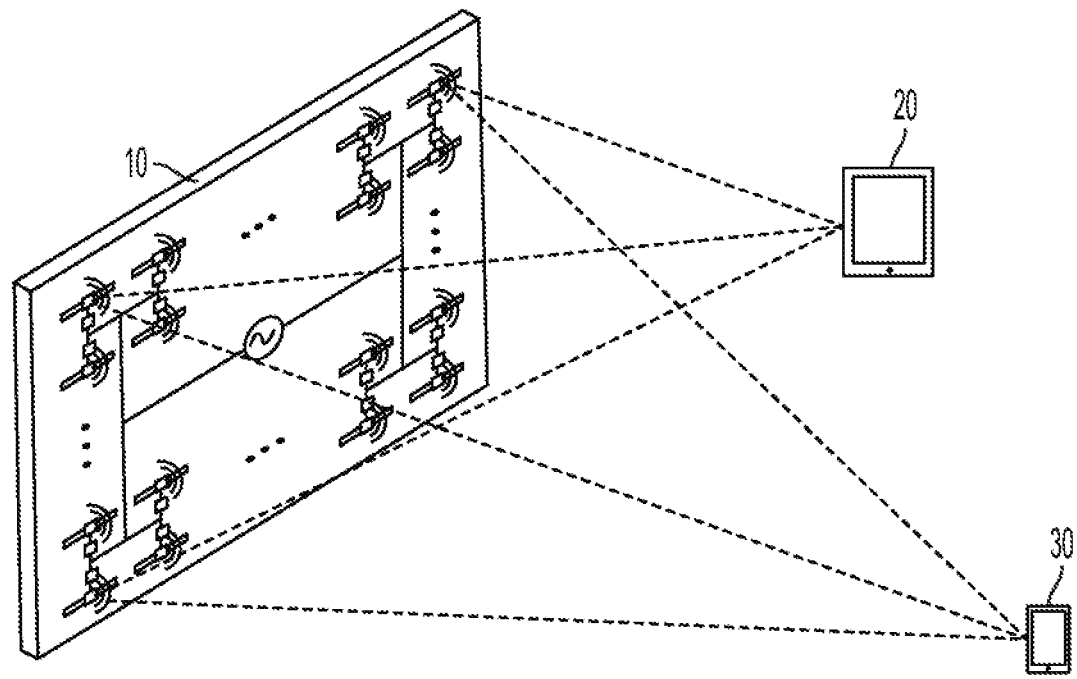
FIG. 2 shows an RF power transmitting/generating unit transmitting RF signals via a multitude of transmit antennas to multiple devices, in accordance with one embodiment of the present invention.

FIG. 2 shows a GU 10 transmitting RF signals to RU 20 and RU 30 using focused waves of similar or different strengths. The powering of the two RUs can be done concurrently, one at a time, alternatively at different rates, or intermittently. RUs 20 and 30 may use the received RF signal to provide power for operation or charge themselves.

Figure 3:
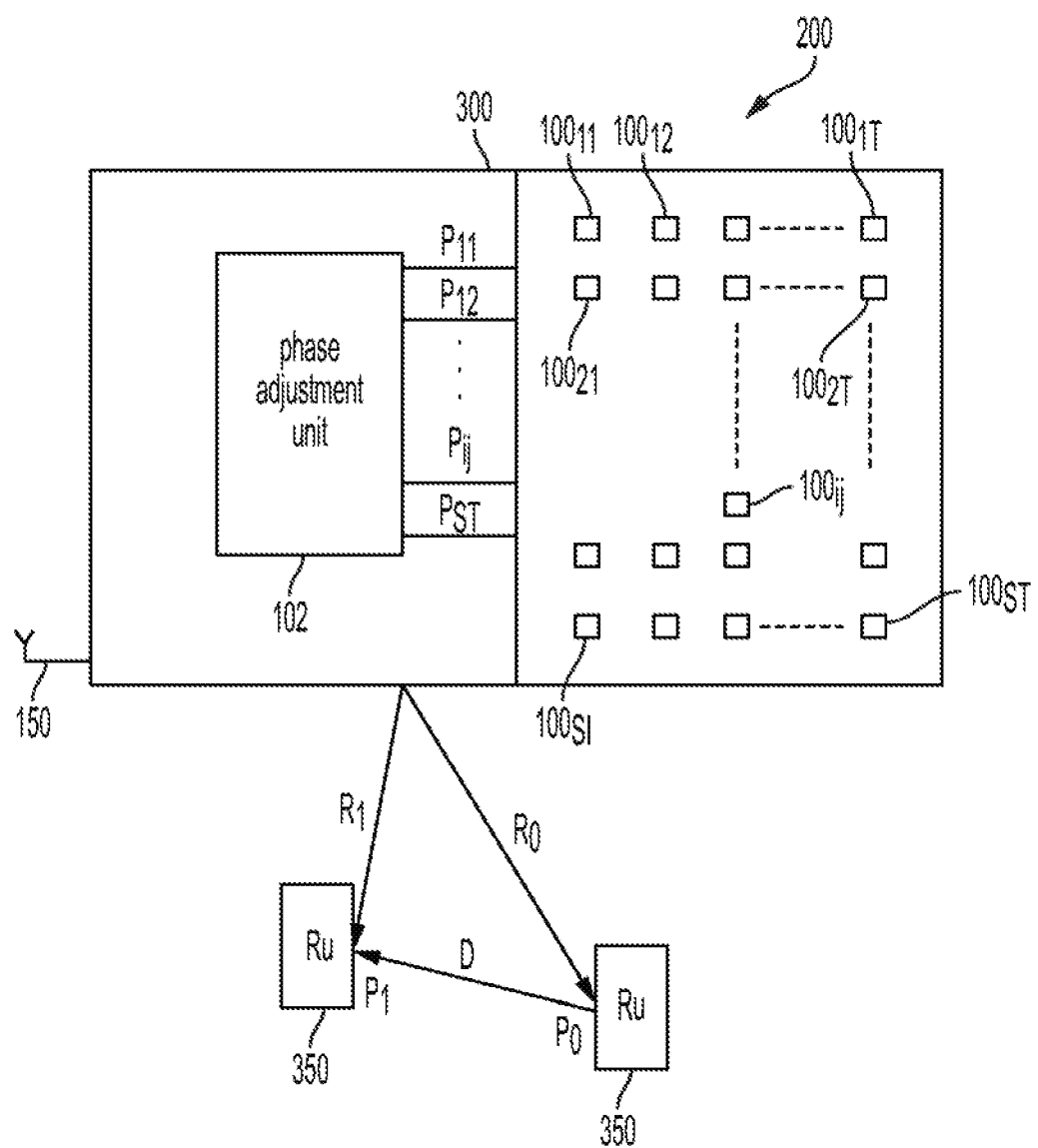
FIG. 3 is a simplified block diagram of an RF transmitting/generating unit delivering power wirelessly to a receiving unit as the receiving unit changes its position, in accordance with one exemplary embodiment of the present invention.

FIG. 3 is a simplified block diagram of a GU 300, in accordance with one exemplary embodiment of the present invention, adapted to wirelessly power RU 350. GU 300 is shown as including, in part, a two-dimensional array 200 of transmitting elements arranged along S rows and T columns. For example, the first row of the array is shown as including, in part, transmitting elements $100_{11}, 100_{12} \ldots 100_{1T}$. Similarly, the last row of the array is shown as including, in part, transmitting elements $100_{S1}, 100_{S2} \ldots 100_{ST}$. The RF signal generated by each transmitting element is transmitted by an associated antenna, not shown in FIG. 3 for simplicity. The distance between each pair of adjacent transmitting element such as between transmitting elements $100_{11}, 100_{12}$, or transmitting elements $100_{11}, 100_{21}$ may or may not be the same.

GU 300 is also shown as including, in part, a receive antenna 150, and a phase adjustment unit 102. Receive antenna 150 is adapted to receive information, such as the position coordinates, displacement vector, or orientation of RU 350 from RU 350. RU 350 which may be a cell phone, and the like, often includes various sensing elements for location determination and finding its relative position with respect to its previous location. For example an IMU (inertial magnetic unit) disposed in RU 350 may be used to determine the displacement and estimate the new location and orientation of the RU. Other sensing elements, such as a GPS or other sensors may be configured to identify the location of the RU. In order to receive power, in one embodiment, RU 350 transmits its position (i.e., its position coordinates at point $P_0$) and/or orientation, and similar other information to GU 300. Phase adjustment unit 102 receives the position information provided by RU 350, for example, and in response adjusts the phase of the RF signal transmitted by each of the transmitting elements $100_{ij}$ (i is an index varying from 1 to S and j is an index varying from 1 to T) so that the RF signal is focused on the RU 350 at point $P_0$. As RU 350 moves in the three-dimensional space (shown in FIG. 3 as moving from point $P_0$ to point $P_1$) RU 350 provides either its new position coordinates at $P_1$ or its displacement from its previous position (shown in FIG. 3 as displacement vector D) to GU 300 via antenna 150. In response, phase adjustment unit 102 varies the phases of the transmitting elements $100_{ij}$ via signals $P_{ij}$ so as to cause the RF signal transmitted by the array to remain focused on RU 350 at point $P_1$.

Therefore, GU 300 is adapted to track the RU as the RU moves from its current position $P_0$ to a new location $P_1$. In other words, GU 300 is adapted to vary the phases of the transmitting elements $100_{ij}$ via signals $P_{ij}$ so that the RF signal remains focused on and delivers a substantially maximum power to RU 350 as the RU 350 moves in space to its new location $P_1$. Signals $P_{ij}$ adjusted in response to the new position of RU 350, and as received by antenna 150, are generated as described further below. The tracking is done on a per transmitting element basis which allows for independent operation as well as independent formation of multiple beams. Embodiments of the present invention further enable usage of segments of the array via techniques, such as parallax, for depth measurement.

Figure 4:
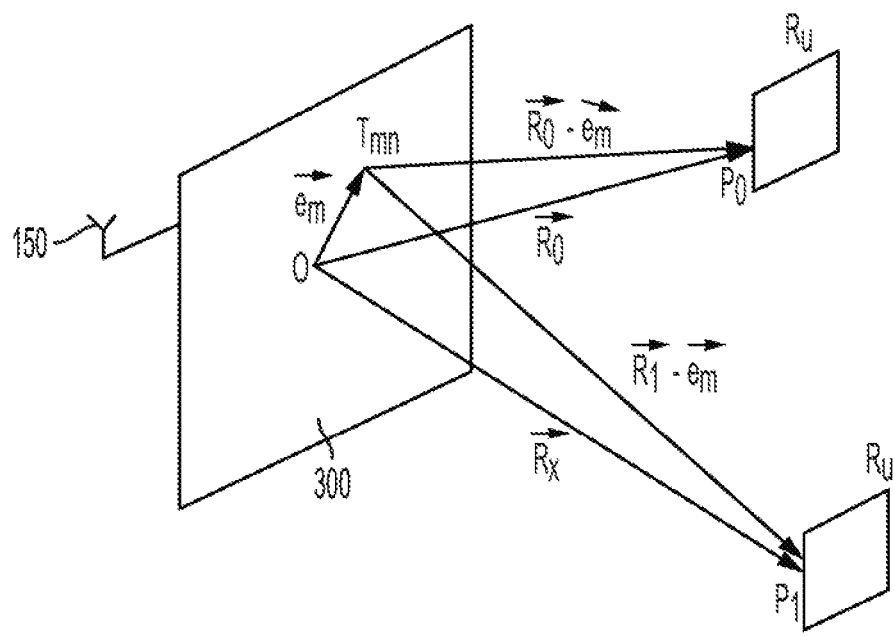
FIG. 4 shows an array of transmitting elements delivering power to a device changing its position from a first point to a second point, in accordance with one embodiment of the present invention.

FIG. 4 shows an array 300 of transmitting elements powering an RU 350 as the RU moves from a first position $P_0$ to a second position $P_1$, in accordance with one embodiment of the present invention. It is understood that for simplicity and clarity the individual transmitting elements of the array are not shown. Assume that the spacing between each pair of adjacent transmitting elements (see FIG. 3) is the same and is represented by d. Assume further that a reference transmitting element is located at the origin O of the xy-plane, and that that the array is initially configured to transmit RF signal to point $P_0$, as shown in FIG. 4. Therefore, transmitting element $T_{mn}$ having indices m and n relative to the origin, has a location defined by vector $\vec{e}_{mn}$:

$$\vec{e}_{mn} = d(m\hat{i} + n\hat{j})$$

The length of the vector $\vec{e}_{mn}$ is defined by:

$$|\vec{e}_{mn}|^2 = d^2(m^2 + n^2) \qquad (1)$$

Position $P_0$ in FIG. 4 is described by the three dimensional vector $\vec{R}_0 = (x_0, Y_0, z_0)$ with respect to the origin O. The difference in any two path lengths, one from e.g. the origin O to position $P_0$, and the other from, e.g. transmitting element $T_{mn}$ to position $P_0$ must be an integer multiple of the wavelength of the signal being transmitted to achieve focusing and beam forming. The path length difference $\Delta l_{mn}$ for the two elements positioned at the origin O and $T_{mn}$, to a location defined by vector $\vec{R}$ is defined by the following expression:

$$\Delta l_{mn}(\vec{R}) = |\vec{R} - \vec{e}_{mn}| - |\vec{R}| = [|\vec{R}|^2 - 2\vec{R} \cdot \vec{e}_{mn} + |\vec{e}_{mn}|^2]^{1/2} - |\vec{R}| \qquad (2)$$

A second order approximation of the equation (2) above yields:

$$\Delta l_{mn}(\vec{R}) = -\vec{e}_{mn} \frac{\vec{R}}{|\vec{R}|} + \frac{|\vec{e}_{mn}|^2}{2|\vec{R}|} - \frac{1}{2|\vec{R}|}\left(\vec{e}_{mn} - \frac{\vec{R}}{|\vec{R}|}\right)^2 \qquad (3)$$

$$= -\vec{e}_{mn}\hat{R} + \frac{|\vec{e}_{mn}|^2}{2|\vec{R}|} - \frac{1}{2|\vec{R}|}\left(\vec{e}_{mn} - \hat{R}\right)^2$$

In equation (3), $\hat{R}$ is the unit vector along the direction of $\vec{R}$ defined and by $$\frac{\vec{R}}{|\vec{R}|}.$$

Furthermore, the term $-\vec{e}_{mn}\hat{R}$ represents the path length for very large distances $|\vec{R}| \gg |\vec{e}_{mn}|$, namely the radiative far field, where the path lengths reduce to the first order approximation as used in classical beamforming:

$$\Delta l_{mn}(\vec{R}) = -\vec{e}_{mn}\frac{\vec{R}}{|\vec{R}|} = -\vec{e}_{mn}\hat{R} \qquad (4)$$

The difference $\Delta \emptyset_{mn,0}$ between phases of the signals at location $P_0$ generated by the two transmitting elements, with one of the transmitting elements positioned at the origin and the other at $T_{mn}$ (i.e., the transmitting element defined by vector at $\vec{e}_{mn}$), is defined by:

$$\Delta \emptyset_{mn,0} \stackrel{2\pi}{\equiv} \emptyset_{mn,0} - \emptyset_{00,0} \stackrel{2\pi}{\equiv} \frac{2\pi}{\lambda}\Delta l_{mn}(\vec{R}_0) + \psi_{mn,0} - \psi_{00,0} \qquad (5)$$

In expression (5), $\lambda$ represents the wavelength of the RF signal, $\emptyset_{00,0}$ represents the phase of the signal at position $P_0$ and generated by the transmitting element positioned at the origin, $\emptyset_{mn,0}$ represents the phase of the signal at position $P_0$ and generated by the transmitting element having a position defined by vector $\vec{e}_{mn}$, $\psi_{00,0}$ represents the phase of the signal as generated by the transmitting element positioned at the origin, and $\psi_{mn,0}$ represents the phase of the signal as generated at the transmitting element having a position defined by vector $\vec{e}_{mn}$, and $$\stackrel{2\pi}{\equiv}$$

represents equivalence module $2\pi$.

Similarly, the difference $\Delta \emptyset_{mn,1}$ between phases of the signals at location $P_1$ (the new position of the recovery device) generated by the same two transmitting elements is defined by:

$$\Delta \emptyset_{mn,1} \stackrel{2\pi}{\equiv} \emptyset_{mn,1} - \emptyset_{00,1} \stackrel{2\pi}{\equiv} \frac{2\pi}{\lambda}\Delta l_{mn}(\vec{R}_1) + \psi_{mn,1} - \psi_{00,1} \qquad (6)$$

For the beam to be focused at point $P_0$, the phase difference $\emptyset_{mn,0}$ is ideally either $2\pi$ or a multiple thereof. Similarly, for the beam to be focused at point $P_1$, the phase difference $\emptyset_{mn,1}$ is ideally either $2\pi$ or a multiple thereof. In other words, the following relationship holds:

$$\Delta \emptyset_{mn,0} \stackrel{2\pi}{\equiv} \Delta \emptyset_{mn,1} \stackrel{2\pi}{\equiv} 0 \qquad (7)$$

Using the above expressions, phase adjustment of the transmitting elements may be quickly determined as the recovery device changes its position. To achieve this adjustment, the phase of the element defined by position vector $\vec{e}_{mn}$ with respect to the phase of the element at the origin may be defined as below:

$$\Delta \psi_{mn,1} \stackrel{2\pi}{\equiv} \psi_{mn,0} - \psi_{00,0} \stackrel{2\pi}{\equiv} \Delta \emptyset_{mn,1} - \frac{2\pi}{\lambda}\Delta l_{mn}(\vec{R}_1) \qquad (8)$$

$$\stackrel{2\pi}{\equiv} \frac{2\pi}{\lambda}[\Delta l_{mn}(\vec{R}_0) - \Delta l_{mn}(\vec{R}_1)] + \Delta \psi_{mn,0}$$

After further simplification, the required phase shift setting at the GU between the element positioned at the origin and the element defined by vector $\vec{e}_{mn}$ may be written as:

$$\Delta\psi_{mn,1} \stackrel{2\pi}{\equiv} \Delta\psi_{mn,0} + \frac{2\pi}{\lambda}\left[\Delta l_{mn}(\vec{R}_0) - \Delta l_{mn}(\vec{R}_1)\right] \stackrel{2\pi}{\equiv} \quad (9)$$

$$\Delta\psi_{mn,0} + \frac{2\pi}{\lambda}\Delta L_{mn}(\vec{R}_0\vec{R}_1)$$

In expression (9), $\Delta l_{mn}(\vec{R}_0\vec{R}_1)$ represents the path length difference associated with transmitting element defined by vector $\vec{e}_{mn}$ and the transmitting element positioned at the origin with respect to target points $P_0$ and $P_0$ whose positions from the origin are defined respectively by $\vec{R}_0$ and $\vec{R}_1$. This path length difference may be defined as:

$$\Delta l_{mn}(\vec{R}_0\vec{R}_1) = [|\vec{R}_0|^2 - 2\vec{R}_0 \cdot \vec{e}_{mn} + |\vec{e}_{mn}|^2]^{1/2} - [|\vec{R}_1|^2 - 2\vec{R}_1 \cdot \vec{e}_{mn} + |\vec{e}_{mn}|^2]^{1/2} + |\vec{R}_1| - |\vec{R}_0|$$

The above expression may further be approximated as:

$$\Delta l_{mn}(\vec{R}_0\vec{R}_1) \approx \quad (10)$$

$$-\vec{e}_{mn}(\hat{R}_1 - \hat{R}_0) + \frac{|\vec{e}_{mn}|^2}{2}\left(\frac{1}{|\vec{R}_1|} - \frac{1}{|\vec{R}_0|}\right) - \frac{(\vec{e}_{mn} \cdot \hat{R}_0)^2}{2|\vec{R}_0|} + \frac{(\vec{e}_{mn} \cdot \hat{R}_1)^2}{2|\vec{R}_1|}$$

The first term $-\vec{e}_{mn}(\hat{R}_1 - \hat{R}_0)$ in expression (10) represents the parallel beam forming, namely the focus in the far field (infinity). Accordingly, this term reduces to zero for two points along the same line, but at different distances. The other terms in expression (10) are due to focusing in finite distances. The phase shift of each element may be generated differently.

In the embodiment shown in FIG. 3, the phase setting $P_{ij}$ for each transmit element for any given point in space is set using a codeword. In other words, each codeword uniquely defines, for each point in space, the phase setting $P_{ij}$ for each of the N×M transmit elements of the array. A codeword is alternatively referred to herein as a control word represented by parameter Ctrl_word For the embodiment shown in FIG. 3, the relationship between the phase of a transmitting element, such as transmitting element defined by vector $\vec{e}_{mn}$, and the control word Ctrl_word$_{mn}$ associated with that transmitting element is a non-linear relationship that may be defined as:

$$\psi_{mn} = \psi(\text{Ctrl\_word}_{mn}) \quad (11)$$

Expression (11) may be written as:

$$\psi_{mn} = a_{mn}C_{mn} + b_{mn} \quad (12)$$

Using linear approximation and combining expression (12) and expression (9), shown again below:

$$\Delta\psi_{mn,1} \stackrel{2\pi}{\equiv} \Delta\psi_{mn,0} + \frac{2\pi}{\lambda}\Delta L_{mn}(\vec{R}_0\vec{R}_1) \quad (9)$$

the following result is achieved:

$$a_{mn}C_{mn,1} + b_{mn} - (a_{00}C_{00,1} + b_{00}) \stackrel{2\pi}{\equiv} \quad (13)$$

$$a_{mn}C_{mn,0} + b_{mn} - (a_{00}C_{00,0} + b_{00}) + \frac{2\pi}{\lambda} + \Delta l_{mn}(\vec{R}_0\vec{R}_1)$$

The above expression (13) may be further simplified as shown below:

$$a_{mn}(C_{mn,1} - C_{mn,0}) \stackrel{2\pi}{\equiv} a_{00}(C_{00,1} - C_{00,0}) + \frac{2\pi}{\lambda} + \Delta l_{mn}(\vec{R}_0\vec{R}_1) \quad (14)$$

The term $C_{00}$ may be set to 0 for all settings without loss of generality. In other words, $C_{00,1} - C_{00,0} = 0$. Therefore, the change in control word Ctrl_word as the recovery device moves from position $P_0$ to position $P_0$ may be defined as:

$$\Delta C_{mn} = (C_{mn,1} - C_{mn,0}) \stackrel{2\pi}{\equiv} \frac{2\pi}{a_{mn}} + \frac{\Delta L_{mn}(\vec{R}_0\vec{R}_1)}{\lambda} \quad (15)$$

It is understood that the matrix defined by $\Delta L_{mn}(\vec{R}_0\vec{R}_1)$ includes as many elements as there are transmitting elements. Once the recovery device moves to a new position, the change in the codeword as represented by signals $P_{ij}$ for each transmit element is computed once.

In one exemplary embodiment, a predetermined focusing spot with respect to the transmitter can be used to run an optimization algorithm or code. To achieve this, the recovery device or RU, either as part of a larger system or standalone, may be placed at the location where the codeword optimization is run. Such optimization may serve as a reference point for all subsequent beam refocusing that can be used in a variety of application, such as power transfer to a different locations, volumetric sensing, and communications.

The initial reference point may also be achieved by using a retroreflector or a generally reflective RF surface placed at the target location. A multitude of receivers included in the GU will receive and/or measure the reflected power. The codeword for each point space is considered optimized when the power measured at that point in space is maximized. The retroreflector may be mounted at a known location in the room, or be initially calibrated by an independent RU.

The dynamic volumetric refocusing can be co-integrated with an inertia measurement unit (IMU) or a magnetic measurement unit (magnetometer) disposed in the RU. The IMU together with a magnetometer and other sensors (e.g. GPS) disposed in the RU can provide information about the position, orientation and displacement of the RU. The displacement may be then by used to provide an estimate of the new position of the RU as the RU moves. The position, orientation and the displacement of the RU is subsequently transferred to the GU, as described herein.

The information transmitted to the GU by the RU enables the GU to perform volumetric dynamic refocusing to redirect the beam to the RU's new location. This enables the GU to avoid optimizing the phase settings each time the RU moves to a new location.

By changing the codeword via signals $P_{ij}$ (i.e., the phase settings of the transmitting elements of the GU associated with each point in space) using the information about position, displacement and/or orientation of the RU, as transmitted from the RU to the GU, embodiments of the present invention substantially enhance the quality of the beam refocusing while at the same significantly reducing the time it would otherwise take to refocus the beam. In other words, embodiments of the present invention provide rapid predictive tracking of the RU units, leading to an enhanced performance in various applications, such as wireless power transfer, sensing and communications. Some embodiments of the present invention may include an a linear quadratic estimator, such as Kalman Filter.

In one embodiment, phase adjustment unit 102 includes a phase/frequency locked loop (not shown). The slope of a clock multiplexer unit (CMU) disposed in such a phase/frequency represents parameter $a_{mn}$ described above, and its phase dependence may be determined by a local sweep of the CMU and monitoring of the receiver elements disposed in the GU for accurate calibration. In such embodiment, the PLL sets the phases of the transmitting elements 100ij in accordance with the codeword so as to maximize the power delivered at the location of RU through constructive interference. In one embodiment, the codeword associated with each point in space and used to adjust the phase of each transmit element of an array may be stored in a lookup table (LUT). In another embodiment, only the difference between the codeword associated with a reference point and the codewords associated with all other points are stored in the lookup table. Because the values $L_{mn}(\vec{R}_0 \vec{R}_1)$ are dependent on the geometry and relative distances, during an initial set up, the codeword necessary to achieve a certain phase adjust for each transmit element may be determined at the factory and stored in a look up table. For example, it may be determined during the factory set-up, that transmitting element $T_{mn}$ may require a 20° phase shift to refocus the RF power on a second position ($P_1$) of a device that was initially at a first position (e.g., $P_0$), as shown in FIG. 4. The 20° phase shift, corresponding to a position change from $P_0$ to $P_1$ is then used to the determine the required codeword associated with the transmitting element $T_{mn}$. It is understood that such a codeword results in a different set of values for signals $P_{ij}$. Using this initial setup, the change in codeword associated with each transmitting element for each position in space is stored in a lookup table. When the transmit array is subsequently deployed at a site by a user, to track the target device as the device changes its position and relays its new position to the transmit array, as described above, the values in the lookup tables for each transmit element and associated with that position are quickly retrieved to focus the RF signal to the device's new position.

In some embodiments, the position of the target device may be determined using such a look-up table. To achieve this, for each sweep of the codewords, the amount of power received by the device is measured and relayed to the transmit array. The codeword resulting in the maximum power delivery to the device uniquely defines the position of the device from the array.

The modulo per element $$\left(\frac{2\pi}{a_{mn}}\right)$$

may also be measured directly by the same method, where each element of the CMU is swept and the RF signal is measured by each receiver element of the GU. Such values may be updated as temperature and other environmental conditions change, and may also be stored in a local look-up table.

The values of the terms $\Delta L_{mn}(\vec{R}_0 \vec{R}_1)$ may be stored in a lookup table as they do not need to be recalculated every time. In one embodiment, the various parameter values of $\Delta L_{mn}(\vec{R}_0 \vec{R}_1)$ may be separately and individually stored, thereby further increasing the speed of dynamic volumetric refocusing. For each $\vec{R}_0$ and $\vec{R}_1$ pair in a MxN GU array, there are MN values for the $\Delta L_{mn}$ matrix. Assuming a known fixed $\vec{R}_0$ as the reference point, the space may be partitioned into volumetric units in Cartesian or polar coordinates. Using a volumetric grid, the course grid values may be stored and read from a lookup table, and fine grad values may be calculated. The temperature dependence of such values may also be stored.

Figure 5:
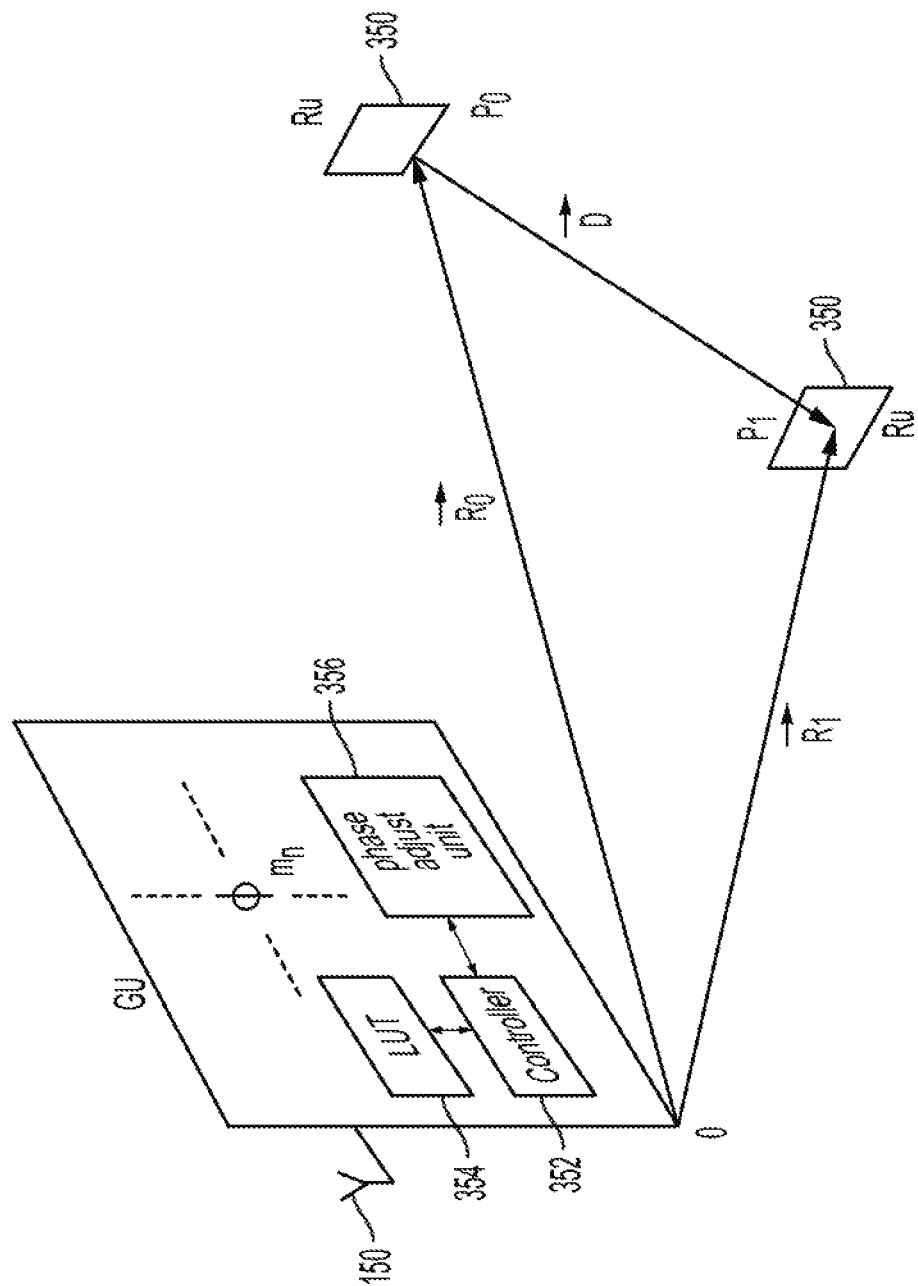
FIG. 5 shows an array of transmitting elements delivering power to a device changing its position from a first point to a second point, in accordance with another embodiment of the present invention.

FIG. 5 shows array 300 of SxT transmitting elements powering an RU 350 as the RU moves from a first position $P_0$ to a second position $P_1$, in accordance with another embodiment of the present invention. For simplicity and clarity only the phase $\emptyset_{mn}$ of transmitting element $T_{mn}$ of the array is shown. The positions $P_0$ and $P_1$ of the RU are determined with respect to the origin O as shown. In the embodiment shown in FIG. 5, the first position $P_o$ of the RU is defined by vector $R_0$ and is known by GU 300 using any of the techniques described herein. As the RU moves from position $P_0$ to position $P_1$, the sensors (e.g. IMU) disposed in the RU determine the displacement vector D defined from position $P_0$ to position $P_1$. Data representing the displacement vector D is then transmitted by RU 350 to GU via antenna 150. Controller 352 disposed in GU 300 then determines the new position $P_1$ of the RU using vectors $R_1$ and D. As described above, lookup table (LUT) 354 includes the phase setting for each transmit element of the array for each position in space around the transmit array. In other words, using the techniques described above, LUT 354 has stored therein the phase setting for each of the SxT transmit elements for each position in space, such as point $P_0$ and $P_1$. Accordingly, controller 352 retrieves from LUT 354 the phase settings for the transmit elements of the array associated with position $P_1$ and applies those phase settings to the transmit elements so as to focus the RF signal to point $P_1$ so as to deliver the RF power to the RU rapidly and efficiently.

Figure 6:
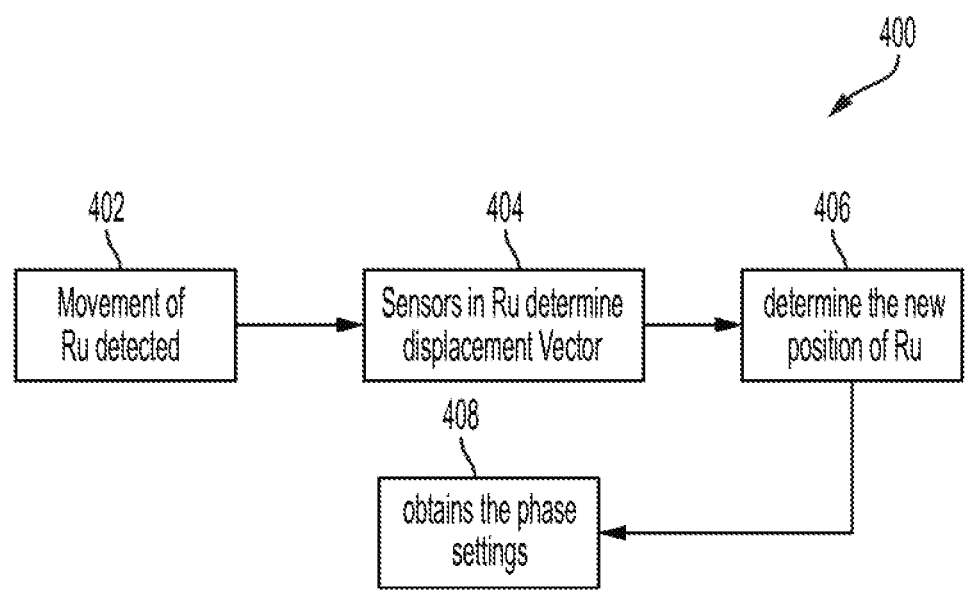
FIG. 6 is a flowchart for adjusting phases of an array of transmit elements as a device being wirelessly powered by the array changes its position, in accordance with one embodiment of the present invention.

FIG. 6 is a flowchart 400 for focusing the RF signal on a RU by a GU as the RU moves. The RU is assumed to be at a known initial position relative to the GU. A movement by the RU to a new location is detected at 402 thereby causing the RU to determine at 404 its displacement vector D pointing from the Rus initial location to its new location. The displacement vector may be determined using, for example, an inertia measurement unit disposed in the RU, and transmitted to the GU. Knowing the initial position of the RU and the displacement vector, at 406, the GU determines the new location of the RU. At 408, the GU obtains and applies the phase settings associated with the new position of the RU to the transmit elements of the array, subsequent to which the process moves to 402.

The above embodiments of the present invention are illustrative and not limitative. Embodiments of the present invention are not limited by the type of Other additions, subtractions or modifications are obvious in view of the present disclosure and are intended to fall within the scope of the appended claims.

What is claimed is:
1. An RF power delivery system comprising:
an N×M array of transmitting elements disposed along N rows and M columns, wherein M an N are integer numbers;
a phase adjustment unit adapted to:
receive information representative of a change in position of a device targeted to receive the RF power wirelessly from the device and generate a codeword in response; and
apply the codeword to adjust phases of the array of transmitting elements, wherein as the device moves from a first position defined by vector $\vec{R}_0$ to a second position defined by vector $\vec{R}_1$, a change in the codeword applied to adjust the phase of a first transmitting element positioned m unit vectors from an origin of the array and along a first axis, and n unit vectors from the origin along a second axis, is defined by a path length difference from the first transmitting element to the first and second positions.

2. The RF power delivery system of claim 1 wherein as the device moves from the first position to the second position, the change in the codeword applied to adjust the phase of the first transmitting element is further defined by a slope of a clock multiplier of a phase/frequency locked loop disposed in the phase adjustment unit.

3. The RF power delivery system of claim 1 wherein as the device moves from the first position to the second position, the codeword applied to adjust the phase of the first transmitting element is retrieved from a look-up table.

4. The RF power delivery of claim 1 wherein said device determines its position using a sensor unit selected from a group consisting of an inertia measurement unit (IMU) or a global positioning system unit.

5. A method of transmitting RF power from an N×M array of transmitting elements disposed along N rows and M columns to a device, M and N being integers, the method comprising
receiving a position of a device wirelessly from the device;
generating a codeword in response to the position of the device; and
adjusting phases of the array of transmitting elements in accordance with the codeword, wherein as the device moves from a first position defined by vector $\vec{R}_0$ to a second position defined by vector $\vec{R}_1$, a change in the codeword applied to adjust the phase of a first transmitting element positioned m unit vectors from an origin of the array and along a first axis, and n unit vectors from the origin along a second axis, is defined by a path length difference from the first transmitting element to the first and second positions.

6. The method of claim 5 wherein as the device moves from the first position to the second position, the change in the codeword applied to adjust the phase of the first transmitting element is further defined by a slope of a clock multiplier of a phase/frequency locked loop adapted to adjust the phases of the array of transmitting elements.

7. The method of claim 5 wherein as the device moves from the first position to the second position, the codeword applied to adjust the phase of the first transmitting element is retrieved from a look-up table.

8. The method of claim 5 wherein said device determines its position using a sensor unit selected from a group consisting of an inertia measurement unit (IMU) or a global positioning system unit.

* * * * *